United States Patent
Chou et al.

(10) Patent No.: US 8,059,403 B2
(45) Date of Patent: Nov. 15, 2011

(54) HEAT DISSIPATION DEVICE

(75) Inventors: Chia-Hsing Chou, Taipei (TW); Po-Wen Shih, Taipei (TW); Shang-Yi Wang, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 185 days.

(21) Appl. No.: 12/683,409

(22) Filed: Jan. 6, 2010

(65) Prior Publication Data

US 2010/0188817 A1    Jul. 29, 2010

(30) Foreign Application Priority Data

Jan. 23, 2009 (TW) .............................. 98102934 A

(51) Int. Cl.
*H05K 7/20* (2006.01)
(52) U.S. Cl. .................. 361/695; 361/694; 361/719
(58) Field of Classification Search .................. None
See application file for complete search history.

(56) References Cited

U.S. PATENT DOCUMENTS

| | | | | |
|---|---|---|---|---|
| 6,130,820 | A * | 10/2000 | Konstad et al. | 361/695 |
| 6,775,139 | B2 * | 8/2004 | Hsueh | 361/697 |
| 7,085,134 | B2 | 8/2006 | Foster, Sr. et al. | |
| 7,679,913 | B2 * | 3/2010 | Hsieh | 361/704 |
| 2004/0130873 | A1 * | 7/2004 | Hsueh | 361/697 |
| 2005/0195568 | A1 | 9/2005 | Shyr | |
| 2009/0219687 | A1 * | 9/2009 | Lin | 361/695 |

FOREIGN PATENT DOCUMENTS

| | | |
|---|---|---|
| CN | 1218391 C | 9/2005 |
| CN | 1243298 C | 2/2006 |
| TW | 523134 | 3/2003 |
| TW | M265698 | 5/2005 |
| TW | 200621140 | 6/2006 |
| TW | M346846 | 12/2008 |

OTHER PUBLICATIONS

"1st Office Action of China Counterpart Application", issued on Jul. 29, 2011, p. 1-p. 5, in which the listed references were cited.
"Office Action of Taiwan Counterpart Application", issued on Jul. 13, 2011, p. 1-p. 4, in which the listed references were cited.

\* cited by examiner

*Primary Examiner* — Gregory Thompson
(74) *Attorney, Agent, or Firm* — Jianq Chyun IP Office

(57) ABSTRACT

A heat dissipation device is used for dissipating heat generated from a plurality of memory modules inserted on a motherboard. The memory modules are parallel to each other. Two hooks are disposed at two ends of the slot of each memory connector, respectively, to clamp the memory module corresponding to the slot when the memory module is inserted in the slot. The heat dissipation device includes two fixing frames, a connection frame, and two fans. The two fixing frames are disposed at two opposite ends of the memory connectors and fastened with the hooks at two ends of each slot, respectively. Additionally, the connection frame is connected between the two fixing frames. The two fans are disposed on the two fixing frames, respectively. An air inlet of one of the two fans faces an air outlet of the other one.

9 Claims, 2 Drawing Sheets

US 8,059,403 B2

HEAT DISSIPATION DEVICE

CROSS-REFERENCE TO RELATED APPLICATION

This application claims the priority benefit of Taiwan application serial no. 98102934, filed on Jan. 23, 2009. The entirety of the above-mentioned patent application is hereby incorporated by reference herein and made a part of specification.

BACKGROUND OF THE INVENTION

1. Field of the Invention

The invention relates to a heat dissipation device and, more particularly, to a heat dissipation device used at a memory module.

2. Description of the Related Art

In recent years, along with quick development of computer technology, operation speed of a computer is gradually increased, and then heat generation power of electronic components in a main body of the computer is gradually increased. If the electronic components in the main body of the computer become overheated, they may temporarily or permanently lose effectiveness. To avoid this situation, heat dissipation performance of the electronic components in the computer becomes very important. As a result, besides cooling fans disposed at a computer housing and a power supply, heat dissipation devices need to be additionally disposed to the electronic components whose temperature easily becomes high such as a central processing unit (CPU), a graphics processing unit (GPU), and a memory module on a motherboard to reduce temperature of the electronic components in high-speed operation. Thus, the main body of the computer operates more smoothly.

Presently, a cooling plate is usually disposed on the memory module directly to dissipate the heat for the memory module, and then the cooling plate is utilized to increase heat dissipation area to dissipate heat. However, heat cannot be effectively dissipated out of the memory module only in a natural convection way, and thus heat dissipation effect is not good.

BRIEF SUMMARY OF THE INVENTION

The invention provides a heat dissipation device, and the heat dissipation device can be firmly disposed beside memory modules and provide direct and effective heat dissipation effect to the memory module.

To describe the invention specifically, a heat dissipation device is provided here. The heat dissipation device is used for dissipating heat from a plurality of memory modules inserted on a motherboard. The motherboard has a plurality of memory connectors. Each of the memory connectors has a slot for inserting one of the memory modules. Two hooks are disposed at two ends of the slot of each of the memory connectors, respectively, to clamp the memory module corresponding to the slot when the memory module is inserted in the slot. The heat dissipation device according to the invention includes two fixing frames, a connection frame, and two fans. The two fixing frames are disposed at two opposite ends of the memory connectors and fastened with the hooks at two ends of each of the slots, respectively. Additionally, the connection frame is connected between the two fixing frames. The two fans are disposed on the two fixing frames, respectively. An air inlet of one of the fans faces an air outlet of the other fans.

According to an embodiment of the invention, each of the fixing frames has a fixing groove at a side facing the corresponding hooks, and each of the hooks has a protrusion portion fastened to the fixing groove.

According to an embodiment of the invention, each of the fixing frames has a fixing hole, and two ends of the connection frame are inserted in the fixing holes of the two fixing frames, respectively.

According to an embodiment of the invention, the shapes of the two fixing holes cooperate with the outlines of the two ends of the connection frame, respectively.

According to an embodiment of the invention, the heat dissipation device includes two first fixing screws passing through the two fixing holes, respectively, to fix the corresponding fixing frames to the two ends of the connection frame.

According to an embodiment of the invention, each of the fans has at least a guide slot parallel to a height direction of the memory modules.

According to an embodiment of the invention, the heat dissipation device further includes a plurality of second fixing screws passing through at least one of the guide slots of the corresponding fan, respectively, to fix the corresponding fan to the fixing frames.

According to an embodiment of the invention, the heat dissipation device further includes a cooling plate disposed on a top of the memory modules.

According to an embodiment of the invention, the heat dissipation device further includes at least a top fan disposed on the cooling plate.

As stated above, two fans with the same air outlet direction are disposed at two ends of the memory module, respectively, and then heat from the memory modules are directly dissipated out via airflow generated from the two fans to provide good heat dissipation effect. Additionally, other fixing structures do not need to be additionally disposed on the motherboard, and via the cooperation of the structures of the connection frame, the fixing frames, and the memory connectors, the fan can be firmly fixed beside the memory modules. Thus, not only space of the motherboard can be utilized effectively, normally operation of the fans can also be ensured.

These and other features, aspects and advantages of the present invention will become better understood with regard to the following description, appended claims, and accompanying drawings.

DETAILED DESCRIPTION OF THE EMBODIMENTS

Figure 1:
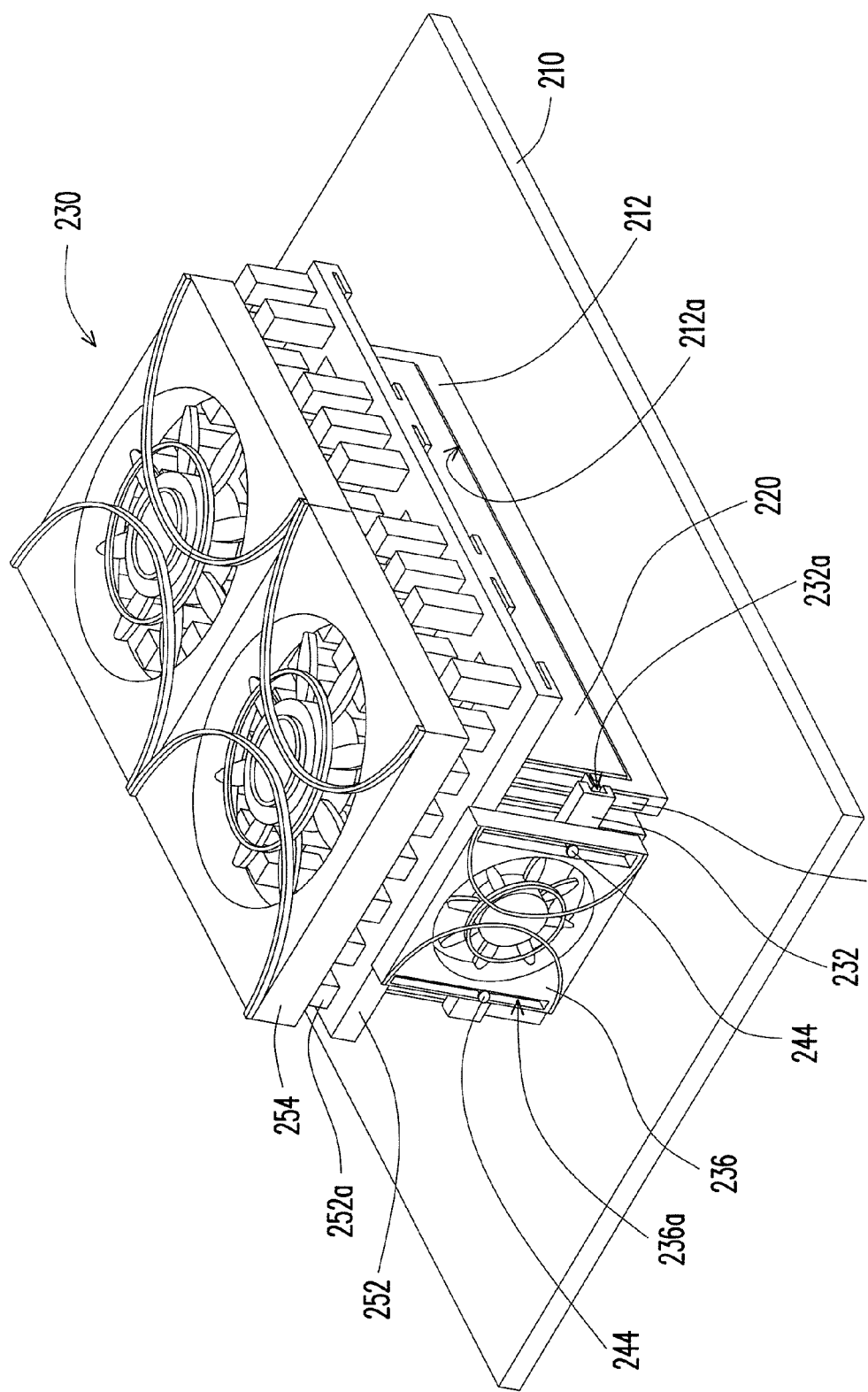
FIG. 1 is an assembly diagram showing a heat dissipation device according to an embodiment of the invention.
Figure 2:
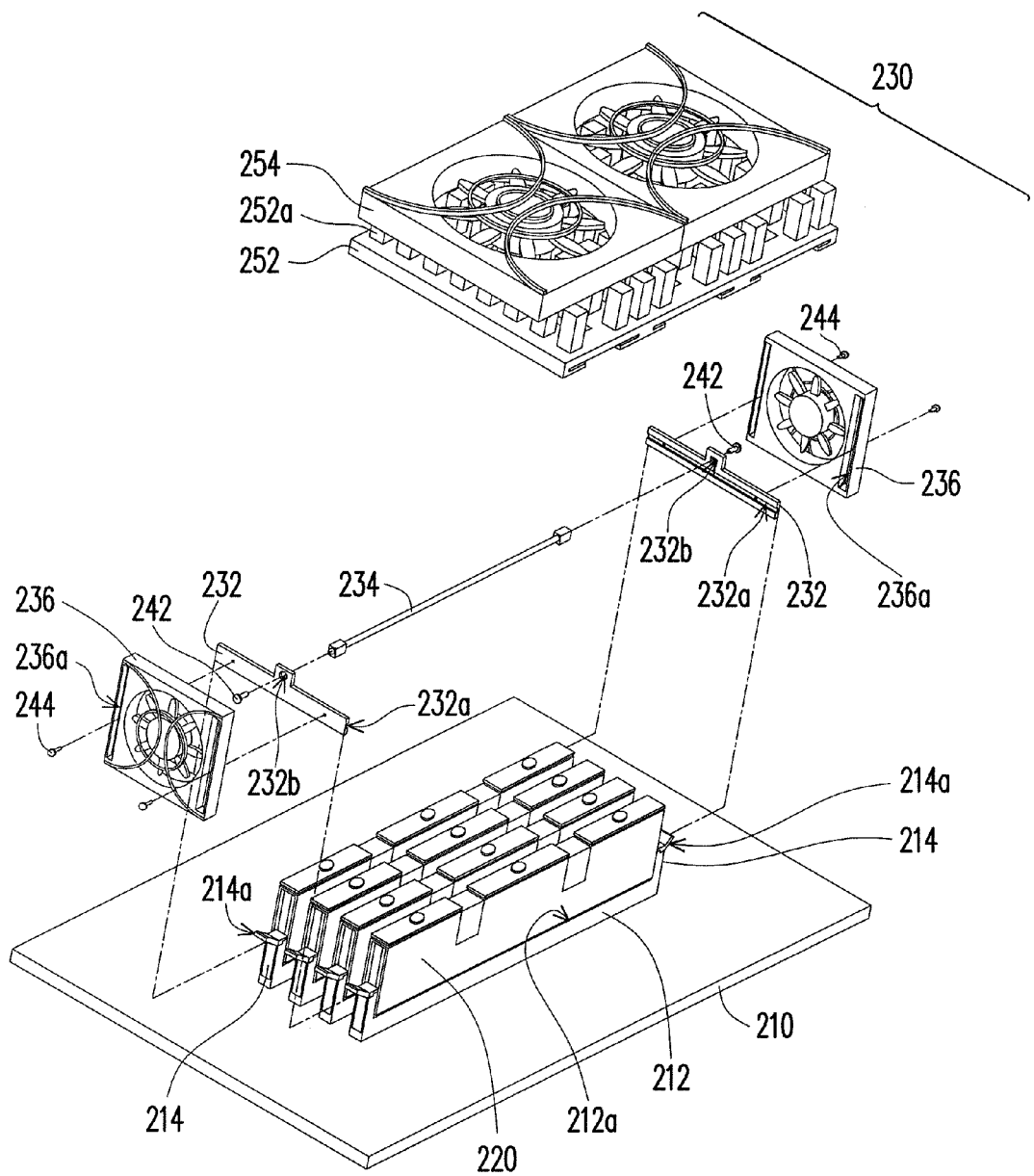
FIG. 2 is an exploded diagram showing the heat dissipation device in FIG. 1.

FIG. 1 is an assembly diagram showing a heat dissipation device according to an embodiment of the invention. FIG. 2 is an exploded diagram showing the heat dissipation device in FIG. 1. As shown in FIG. 1 and FIG. 2, a heat dissipation device 230 is disposed on a motherboard 210 to dissipate heat from a plurality of memory modules 220 inserted on the motherboard 210. In this embodiment, the motherboard 210 has a plurality of memory connectors 212 parallel to each other, and each of the memory connectors 212 has a slot 212a for inserting the memory modules 220 parallelly. To fix the memory module 220 in the slot 212a of the memory connector 212, two hooks 214 are disposed at two ends of the slot 212a of each memory connector 212, respectively. The hooks 214 clamp the memory module 220 corresponding to the slot 212a when the memory module 220 is inserted in the slot 212a.

The heat dissipation device 230 in this embodiment includes two fixing frames 232, a connection frame 234, and two fans 236. The fixing frames 232 are disposed at two opposite ends of the memory connectors 212 and fastened with the hooks 214 at two ends of each of the slots 212a, respectively. Detailedly speaking, cooperating with the structure of the hook 214, in this embodiment, a fixing groove 232a is formed at a side of each fixing frame 232, and the side faces the corresponding hook 214. The shape of the fixing groove 232a may cooperate with a protrusion portion 214a of the hook 214 to make the protrusion portion 214a of the hook 214 fastened with the fixing groove 232a when the fixing frame 232 is disposed to the memory connectors 212. Thus, the fixing frame 232 may be fixed firmly.

Additionally, to improve structure strength of the whole heat dissipation device 230 and fix the fixing frames 232 to the memory connectors 212, in this embodiment, the connection frame 234 is utilized to connect the fixing frames 232. In this embodiment, the connection frame 234 is rod-shaped. When the heat dissipation device 230 is assembled on the memory modules 220 to dissipate heat from the memory modules 220, the connection frame 234 is disposed between two adjacent memory modules 220, and two ends of the connection frame 234 are connected with the two fixing frames 232, respectively. Furthermore, to facilitate the position of the fixing frames 232 and the connection frame 234, each fixing frame 232 may have a fixing hole 232b, and the two ends of the connection frame 234 are inserted into the fixing holes 232b of the two fixing frames 232, respectively, to connect two fixing frames 232. Additionally, the shapes of the fixing holes 232b of the fixing frames 232 may cooperate with the outlines of the two ends of the connection frame 234. The fixing holes 232b as shown in FIG. 1 is square, and the two ends of the connection frame 234 are blocks which can be fitly hold in the fixing holes 232b. On the other hand, in this embodiment, the connection frame 234 and the fixing frames 232 are fixed via two first fixing screws 242. The two first fixing screws 242 pass through the fixing holes 232b of the corresponding fixing frames 232, respectively, to fix the two fixing frames 232 to the connection frame 234.

As shown in FIG. 1 and FIG. 2, the two fans 236 in this embodiment are disposed at the two fixing frames 232, respectively. To achieve a convection effect, air outlet directions of the two fans 236 are same, that is, an air inlet of one of the fans 236 faces an air outlet of the other fan 236 to generate heat dissipation airflow having the same direction between the memory modules 220. The fans 236 are fixed on the fixing frames 232 via a plurality of second fixing screws 244. In this embodiment, each fan 236 has two guide slots 236a parallel to a height direction of the memory modules 220. The second fixing screws 244 pass through the guide slots 236a to fasten the fans 236 with the fixing frames 232, respectively. In other words, via the guide slots 236a, the position of the fans 236 fixed on the fixing frames 232 can be adjusted. That is, the height of the fans 236 relative to the memory modules 220 can be adjusted to achieve an optimal heat dissipation effect. Certainly, the guide slot 236a is selectable and may be replaced by other structures with the same effect. In this embodiment, the cooperation between the guide slot 236a and the second fixing screws 244 is just taken as an example.

As stated above, in this embodiment, the heat dissipation airflow is generated between the memory modules 220 via the two fans 236 at two sides of the memory modules 220 to dissipate heat from the memory modules 220. This heat dissipation method is more direct and effective. The fans 236 are fixed to the memory connectors 212 via the fixing frames 232 and the connection frame 234, and an assistant position effect is provided via the hooks 214 of the memory connectors 212. Thus, other fixing structures do not need to be additionally disposed on the motherboard 210 to fix the fans 236. Therefore, space of the motherboard 210 and manufacture cost of the heat dissipation device can be effectively saved.

Additionally, as shown in FIG. 1 and FIG. 2, in this embodiment, a cooling plate 252 may be additionally disposed on a top of the memory modules 220, and one or a plurality of top fans 254 may be additionally disposed on the cooling plate 252. Via rotation of the top fan 254, air convection can be driven between the surface of the cooling plate 252 and the cooling fins 252a to provide a better heat dissipation effect.

The shapes of the fixing frames and the connection frame are not limited to the shapes described in the above embodiment. According to different design commands, as long as a same effect can be achieved, the fixing frames and the connection frame with other shapes can be used in the above embodiment to provide the same or better fixing effect for the fans. Additionally, using the screws to connect the fixing frames and the connection frame and connect the fans and the fixing frames is not the only way to achieve the invention. As long as relative components can be fixed effectively, any possible fixing structures may be considered and used.

As stated above, via a simple structure design, two fans having the same air outlet directions are disposed at two ends of the memory module, respectively, to dissipate heat from the memory modules via the heat convection between the memory modules. Since the airflow provided by the fans can directly pass between the memory modules, a direct and effective heat dissipation effect can be provided. Additionally, via the cooperation of the structures of the connection frame, the fixing frames, and the memory connectors, the fan can be firmly fixed beside the memory modules. Thus, space of the motherboard and manufacture cost of the heat dissipation device can be effectively saved, and normally operation of the fans can also be ensured.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A heat dissipation device, used for dissipating heat generated from a plurality of memory modules inserted on a motherboard, wherein the motherboard has a plurality of memory connectors, each of the memory connectors has a slot for inserting one of the memory modules, and two hooks are disposed at two ends of the slot of each of the memory connectors, respectively, to clamp the memory module corresponding to the slot when the memory module is inserted in the slot, the heat dissipation device comprising:

two fixing frames disposed at two opposite ends of the memory connectors and fastened with the hooks at the two ends of each of the slots, respectively;

a connection frame connected between the two fixing frames; and two fans disposed on the two fixing frames, respectively, wherein an air inlet of one of the fans faces an air outlet of the other fan.

2. The heat dissipation device according to claim 1, wherein each of the fixing frames has a fixing groove at a side facing the corresponding hooks, and each of the hooks has a protrusion portion fastened to the fixing groove.

3. The heat dissipation device according to claim 1, wherein each of the fixing frames has a fixing hole, and two ends of the connection frame are inserted in the fixing holes of the two fixing frames, respectively.

4. The heat dissipation device according to claim 3, wherein the shapes of the two fixing holes cooperate with the outlines of the two ends of the connection frame, respectively.

5. The heat dissipation device according to claim 3, further comprising two first fixing screws passing through the two fixing holes, respectively, to fix the corresponding fixing frames to the two ends of the connection frame.

6. The heat dissipation device according to claim 1, wherein each of the fans has at least a guide slot parallel to a height direction of the memory modules.

7. The heat dissipation device according to claim 6, further comprising a plurality of second fixing screws passing through at least one of the guide slots of the corresponding fan, respectively, to fix the corresponding fan to the fixing frames.

8. The heat dissipation device according to claim 1, further comprising a cooling plate disposed on a top of the memory modules.

9. The heat dissipation device according to claim 8, further comprising at least a top fan disposed on the cooling plate.

* * * * *